(12) United States Patent
Ludviksson

(10) Patent No.: US 7,355,171 B2
(45) Date of Patent: Apr. 8, 2008

(54) METHOD AND APPARATUS FOR PROCESS MONITORING AND CONTROL

(75) Inventor: Audunn Ludviksson, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 274 days.

(21) Appl. No.: 10/501,558

(22) PCT Filed: Jan. 28, 2003

(86) PCT No.: PCT/US03/00047

§ 371 (c)(1),
(2), (4) Date: Apr. 26, 2005

(87) PCT Pub. No.: WO03/065132

PCT Pub. Date: Aug. 7, 2003

(65) Prior Publication Data

US 2006/0255260 A1     Nov. 16, 2006

Related U.S. Application Data

(60) Provisional application No. 60/352,210, filed on Jan. 29, 2002.

(51) Int. Cl.
 H01J 49/00    (2006.01)
 H01J 49/14    (2006.01)
(52) U.S. Cl. ..................... 250/288; 250/424
(58) Field of Classification Search ............. 250/288
 See application file for complete search history.

(56) References Cited

U.S. PATENT DOCUMENTS

| | | | |
|---|---|---|---|
| 5,248,636 A | 9/1993 | Davis et al. | |
| 6,124,675 A * | 9/2000 | Bertrand et al. | 315/111.91 |
| 6,750,449 B2 * | 6/2004 | Marcus | 250/288 |
| 6,791,692 B2 * | 9/2004 | Powell et al. | 356/496 |
| 2001/0055649 A1 | 12/2001 | Ogure et al. | |
| 2002/0016077 A1 | 2/2002 | Hwangbo et al. | |

OTHER PUBLICATIONS

Mendecino, et al. "EHS analysis of advanced CVD processes," SEMICON West Treatment Technologies for Engineering, 2001 http://dom.semi.org.*

Polini, et al. "Raman spectroscopy characterization of diamond films on steel substrates with titanium carbide arc-plated interlayer," Thin Solid Films 515 (2006) 1011-1016 Avaliable online through Science Direct www.sciencedirect.com.*

* cited by examiner

Primary Examiner—Robert Kim
Assistant Examiner—Michael Maskell
(74) Attorney, Agent, or Firm—Oblon, Spivak, McClelland, Maier & Neustadt, P.C.

(57) ABSTRACT

A method and apparatus for real-time monitoring of a gaseous environment during a semiconductor process. The method utilizes metastable electronic energy transfer to excite and ionize the chamber gaseous effluent and correlates the fluorescence signals from the excited species and mass spectroscopy analysis of the ions generated with the process status. In addition to the ability to produce excited species that fluoresce, the method has the ability to generate molecular ions from labile compounds, reduce fragmentation and operate at higher pressures than conventional ionization methods.

47 Claims, 5 Drawing Sheets

METHOD AND APPARATUS FOR PROCESS MONITORING AND CONTROL

CROSS REFERENCE TO RELATED APPLICATION

This application claims priority to U.S. provisional application Ser. No. 60/352,210, filed on Jan. 29, 2002, the entire contents of which are herein incorporated by reference.

FIELD OF THE INVENTION

The present invention relates to real-time in-situ monitoring of a gaseous environment and fault detection during a semiconductor processing step.

BACKGROUND OF THE INVENTION

Advanced process control that comprises in-situ process monitoring and fault detection in semiconductor manufacturing is essential for reproducible production of complex structures. In typical etching and film deposition processes, the wafer parameters are measured using test wafers after the processing steps. If the measured parameters are not within the desired tolerances, the process parameters are adjusted and more test wafers are measured to assure process compliance. This post-process method is time consuming, inefficient, and expensive compared to real-time in-situ monitoring techniques.

These drawbacks reveal that real-time, in-situ process monitoring should be used whenever possible. The data that is acquired during a process step is used to improve the process by optimizing process conditions and detecting trends of departure from target values and early recognition of a possible catastrophic failure of the process equipment. In addition to etching and film deposition processes, chamber cleaning and chamber conditioning processes require in-situ monitoring.

Various spectroscopy methods have been established for real-time process monitoring. These methods include qualitative and quantitative analysis of the gaseous chemical species using techniques such as mass spectroscopy (MS) and optical emission spectroscopy (OES). These techniques provide information on the identity and concentration of gaseous species during the manufacturing process, which in turn can be correlated to various physical properties of the substrates.

Mass spectrometers are readily available instruments for detection, identification, and analysis of the components of a gaseous environment. They offer extreme sensitivity for detecting trace amounts of gaseous substances. In MS, the gaseous material is ionized through various techniques and the ions are then collected by the spectrometer. The ion signals are then translated into a mass spectrum that is used to identify what atoms or molecules are present in the gaseous environment.

Due to the relatively high pressure at the process monitoring point of a typical semiconductor process, the gas sampling in MS usually includes a pressure reduction system. The pressure reduction is carried out using a length of capillary tube or a throttle valve, and the mass spectrometer itself is pumped continuously. In this setup, it is possible that the sampling efficiency of the probe has mass dependence and extensive calibration can be necessary.

MS can provide a wealth of information on a process, yet the data are often complex and difficult to interpret. Complicated ion spectra can result from extensive fragmentation of the parent molecules in the mass spectrometer ionization region.

OES is a widely used method for process monitoring and control in semiconductor processing. OES is a non-invasive technique that has an extremely wide dynamic range and can perform process control (e.g., endpoint detection, etch rate, and partial pressure control) and diagnostics concurrently.

The point of monitoring the gaseous environment in semiconductor processes is frequently the process region since an excitation source such as plasma is needed to excite the gaseous species for analysis. A drawback to accessing the processing region for monitoring is that it can be invasive to the plasma and it is a more costly venture than to access regions downstream from the processing region. If the process monitoring point is downstream from the process zone, and therefore separate from the plasma, alternative means for exciting and/or ionizing the gaseous species are required.

The drawbacks for post-process analysis show that there is a need for real-time in-situ process monitoring of semiconductor processes using spectroscopic means that allow for comprehensive analysis of the gaseous environment. The analysis results are correlated to various physical properties of the substrates and can reduce the use of test wafer reiterative monitoring methods. Furthermore, there is a need for means of excitation of the gaseous environment that avoids fragmentation of the gaseous species. Also, there is a need for a monitoring point for process analysis that is non-invasive to the process region and is located downstream from the process zone.

The method of using metastable electronic energy transfer to excite gaseous species has previously been utilized in other types of semiconductor processes. Examples include selective dissociation of process gases for etching or deposition steps. Tokunaga in U.S. Pat. No. 5,874,013 entitled "Semiconductor integrated circuit arrangement fabrication method," and Loewenstein in U.S. Pat. No. 5,002,632 entitled "Method and apparatus for etching semiconductor materials," describe methods to obtain the desired etching species by dispersing an inert gas excited to a metastable state in an etching gas. Markunas in U.S. Pat. No. 5,180,435 titled "Remote plasma enhanced CVD method and apparatus for growing an epitaxial semiconductor layer," describes a CVD apparatus for growing a layer on a substrate using metastable electronic energy transfer to partially dissociate and activate the CVD precursor gas. This leads to film deposition at lower temperatures than for purely pyrolytic processes.

In another example, Dodge in U.S. Pat. No. 4,309,187 entitled "Metastable energy transfer for analytical luminescence," describes an alternative excitation method that uses a dielectric discharge to create metastable nitrogen species. The excitation method is shown to have a large dynamic range where concentrations as high as $10^{15}$ atoms/cc can be measured. The wavelength(s) and intensity of emitted light are used to determine the identity and the concentration of the species of interest.

SUMMARY OF THE INVENTION

The present invention provides an apparatus and method for in-situ process monitoring and control using metastable electronic energy transfer to excite and ionize the effluent gas and utilizes OES technique for detection of the emitted light and MS for analysis of the ions that are generated.

In one embodiment, the method of excitation and ionization of the process gas is carried out through interaction with long-lived metastable rare gas atoms.

It is another object of the present invention to carry out the process monitoring at a location downstream from the etching or deposition zone that is non-invasive to the process.

It is a further object of the present invention to correlate resulting gaseous environment in the process chamber with physical properties of the processed wafers.

It is a further object of the present invention to improve the process by optimizing process conditions and detecting trends of departure from target values.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENT

In general, the present invention provides a method and apparatus for carrying out in-situ process monitoring and endpoint detection of the gaseous environment during a semiconductor process (either in real-time or after a known delay). The invention is capable of detecting and monitoring the chemical environment in a vacuum system using spectroscopic techniques. An apparatus is provided that uses metastable electron energy transfer to electronically excite gaseous atoms and molecules. This energy transfer from the singular excitation source creates ions and also excited species that emit light at wavelengths that are characteristic of the gaseous species present in the gas stream.

The ions that are generated in the metastable electron energy transfer are analyzed by a mass spectrometer that acts as a mass filter and separates and collects the ions according to their mass-to-charge (m/q) ratios. The mass spectrometer can comprise a residual gas analyzer (RGA) or a quadrupole mass spectrometer (QMS). The measured ion current is proportional to the partial pressure of each gaseous species and provides fast real-time responses regarding changes in the process environment. The parameters that can be monitored using the MS data include gas flows, pressure, ratios of gaseous species and gas purities. These parameters are correlated with prior process results and historical data.

In addition to forming ions, the metastable electron energy transfer also raises the energy levels of gaseous species that results in fluorescent emission as the excited species decay to a lower energy state. Detection and spectrum analysis of the fluorescent radiation by OES is used to determine the identity and concentration of the gaseous species.

The extensive MS and OES data obtained with this invention offer detailed information regarding the status of the process. OES only detects excited species that emit characteristic light radiation, and MS detects ionic species in the process environment.

Figure 1:
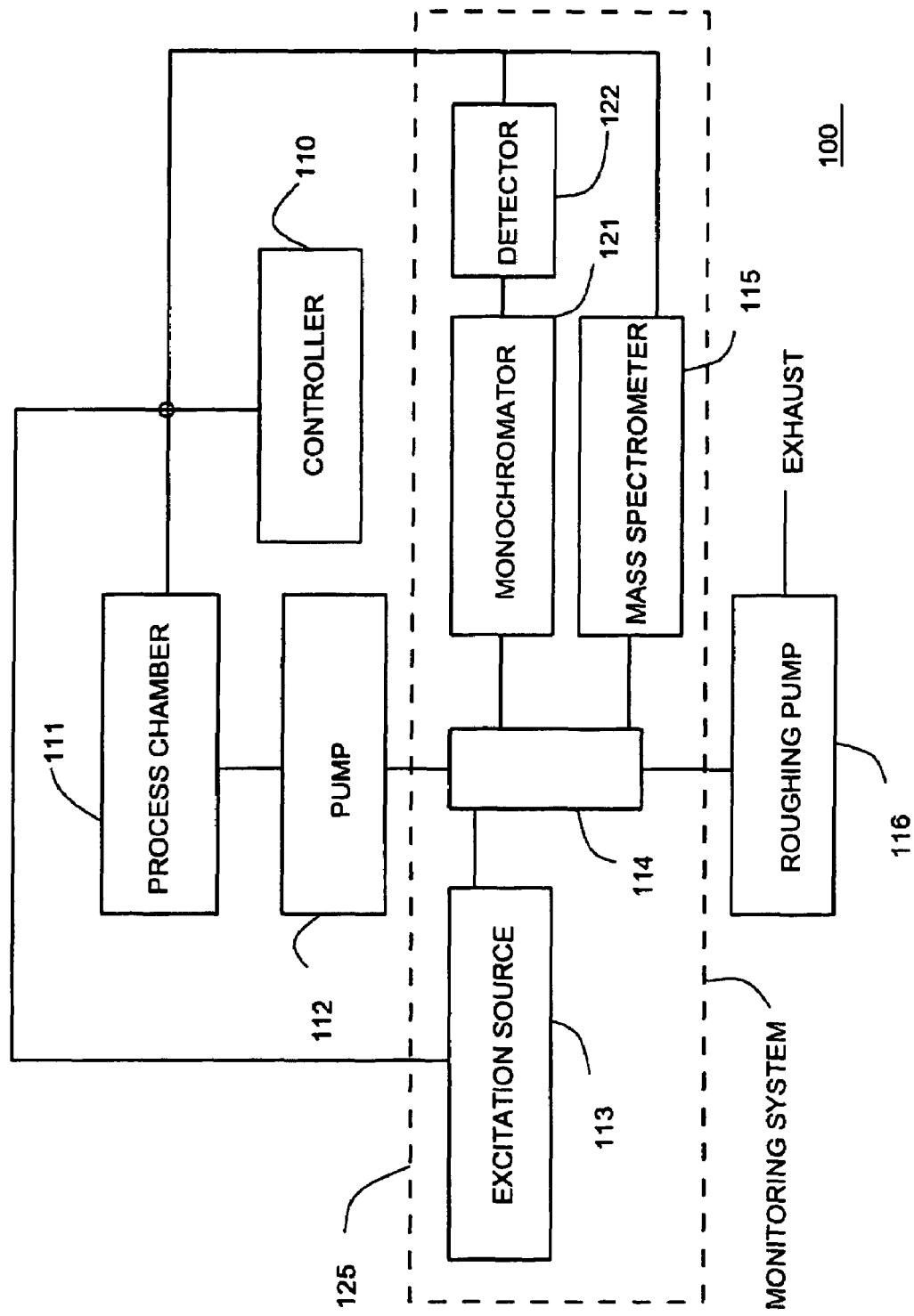
FIG. 1 is a simplified block diagram of a first plasma processing system according to the present invention.

FIG. 1 is a simplified block diagram of a plasma processing system according to the present invention. The system 100 comprises a process chamber 111 that can accommodate semiconductor processes such as etching, chemical vapor deposition (CVD) or physical vapor deposition (PVD). A pump 112 is located downstream from the process chamber 111 for removing the gaseous stream from the process chamber. The pump 112 can be, for example, a turbomolecular pump (TMP). A monitoring system 125 comprises a separate excitation source 113 for generating the metastable species, chamber effluent system 114, monochromator 121, detector 122 and mass spectrometer 115. Chamber effluent system 114 is attached downstream from the pump 112. A controller 110 controls the process and acquires data from the monitoring equipment. A roughing pump 116 exhausts the gases from the monitoring zone.

Figure 2:
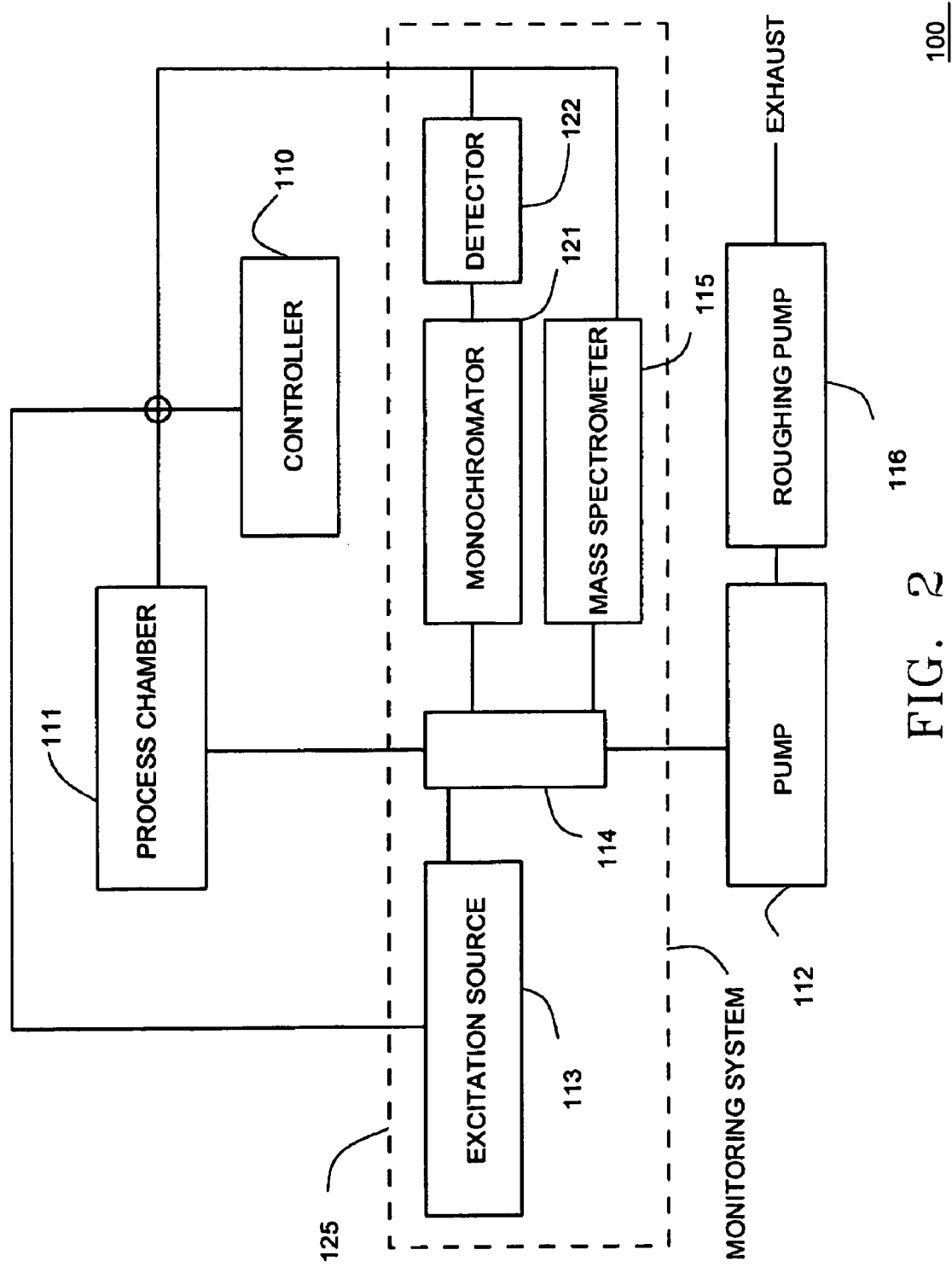
FIG. 2 is a simplified block diagram of a second plasma processing system according to the present invention.

FIG. 2 is a simplified block diagram of a plasma processing system according to the present invention. The setup in FIG. 2 differs from the setup in FIG. 1 in that the monitoring system 125 is located upstream from the pump 112 and the pump 116. The pressure of gaseous environment varies at the different locations of the monitoring system 125 depicted in FIGS. 1 and 2. In an etching process, the gas pressure in the process chamber is usually lower than the gas pressure downstream from pump 112. In a CVD process, this is usually reversed. The location of the monitoring system that is selected depends therefore on the type of process that is carried out and the level of monitoring that is required.

Alternatively, the monitoring system 125 can be located downstream from both pump 112 and pump 116. In various setups, the monitoring system can be a part of an abatement system.

Figure 3:
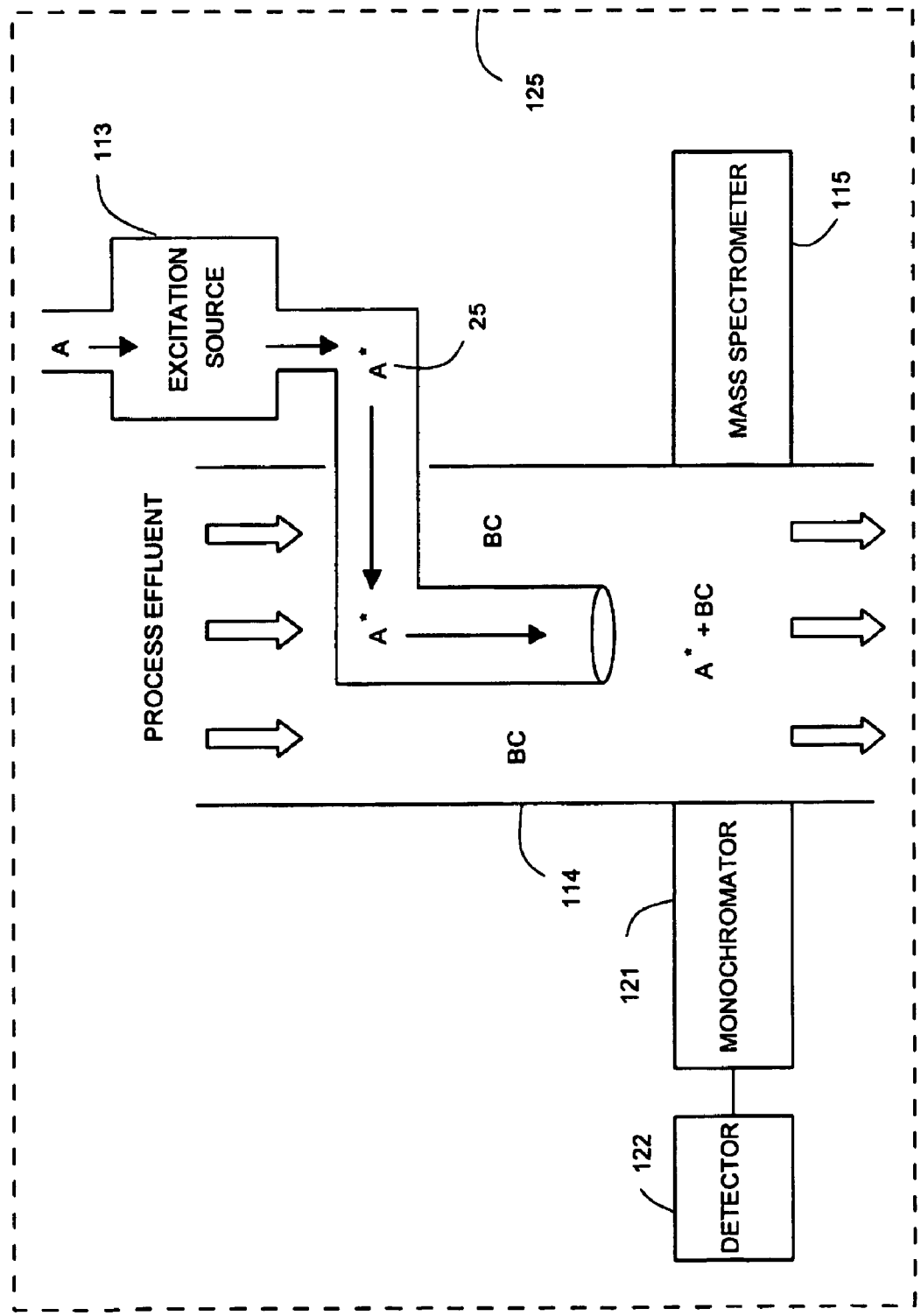
FIG. 3 is a schematic view of one configuration of the apparatus for monitoring a gaseous environment according to the present invention.

FIG. 3 is a schematic view of one configuration of the apparatus for monitoring a gaseous environment according to the present invention. The monitoring system 125 comprises a downstream chamber effluent system 114. Desirably, the effluent system is easily modified to accommodate the monitoring system. The metastable species 25 are created in a gas flow system that includes an excitation source 113 such as a dielectric discharge source or microwave plasma source and are introduced into the chamber effluent gas stream downstream from the process zone. The dispersion of the metastable gas stream in the effluent gas flow can be carried out using a variety of different setups.

In FIG. 3, a monochromator 121 and a mass spectrometer 115 are located near the mixing zone of the effluent gas and the metastable species. Desirably, the downstream distance from the introduction of the metastable species to the mass spectrometer 115 and the monochromator 121, is long enough to insure good dispersion and short enough to avoid significant sample loss. Since the ions form from the interaction of the metastable species and the effluent gas, a conventional mass spectrometer ionizer is not needed but can be included for ionizing the gas.

The method of ionization described in this invention can remove the need for a conventional pressure reduction apparatus for MS, which makes this invention a true in-situ monitoring method. This is due to the formation of ions using metastable electronic energy transfer instead of using a glowing filament in the ionizer region of the mass spectrometer. Alternatively, pressure reduction methods such as capillary or orifice sampling along with differential pumping can be employed to reduce the pressure inside the mass spectrometer.

Excitation of gas molecules using metastable electronic energy transfer has been shown to allow selective ionization and control over the degree of ion fragmentation. This is due to the fact that the energy that is transferred upon ionization is not only variable but also quantized and the amount of available energy depends on the selection of the metastable atom or molecule. It is desirable to create only one ion per component in a gas mixture to reduce the number of ion species and have most of the ion current in the molecular ion to increase sensitivity.

The maximum internal energy of the resulting ion in metastable electronic energy transfer is E*−IE, where E* is the stored electronic energy of the metastable atom and IE is the ionization energy of the molecule to be analysed. If the metastable species has an excitation just above IE, the difference E*−IE will be close to zero and fragmentation will be substantially reduced or eliminated. Conversely, if the difference E*−IE is large then the extent of fragmentation can be very significant. Thus, the extent of fragmentation can be controlled by the choice of the gas selected to form the metastable species. Reduced fragmentation is advantageous since it simplifies the mass spectra in situations where many ion species and ion fragments can be produced and reduced fragmentation allows for monitoring the molecular ion.

The de-excitation mechanism that results in ionization of a compound by a metastable atom or molecule is called Penning ionization. As a metastable species collides with a neutral molecule BC in the gas phase, an electron from a BC orbital interacts with a vacant orbital of the metastable species A* and an electron is ejected from species A. The ejected electron (e) can take a range of kinetic energies that is defined by the species involved in the gas phase collision. As shown in Table 1, the result of the collision between A* and BC may simply be to ionize BC and form $BC^+$ (Eq. 1), fragment BC into $B^+$ and C (Eq. 2) (or B and $C^+$), or create $ABC^+$ (Eq. 3). The formation of the molecular ion $BC^+$ is usually preferred to reduce the number of ion species and maximize the sensitivity.

TABLE 1

| Penning Ionization | Eq. |
| --- | --- |
| A* + BC → $BC^+$ + A + e | (1) |
| A* + BC → $B^+$ + C + A + e | (2) |
| A* + BC → $ABC^+$ + A + e | (3) |

A number of different atoms and molecules can be used as source of metastable species. The rare gases (He, Ne, Ar, Kr or Xe) are frequently used due to their low reactivity and easily accessible metastable levels, but molecules such as $N_2$ and CO can also be used. As is shown in Table 2, the metastable energies of the various rare gases vary with atomic weight. For example, metastable states of He are 19.8 and 20.6 eV, whereas the metastable states of Ar are 11.6 and 11.7 eV. Desirably, a gas is chosen that is substantially inert when subjected to a discharge and then mixed with the gas to be ionized, and which provides a suitable excitation energy for exciting and/or ionizing the gas molecules in the effluent gas stream.

TABLE 2

| Rare gas | Metastable energies of rare gases (eV) |
| --- | --- |
| He | 19.8, 20.6 |
| Ne | 16.6, 16.7 |
| Ar | 11.6, 11.7 |
| Kr | 9.9, 10.6 |
| Xe | 8.3, 9.4 |

In FIG. 3, electron bombardment in the excitation source 113 excites the rare gas atoms into a host of excited electronic states. These states decay quickly to the ground state or one of the lower metastable states. As the gaseous species are removed from the excitation region, the metastables and the ground state atoms are dominant. In the case of metastable He atoms, the $2^1S$ (20.6 eV) state has the shorter decay time or effective lifetime of $2 \times 10^{-8}$ sec vs. $6 \times 10^{-3}$ sec for the $2^3S$ (19.8 eV) state. Therefore, the He gas flow is reduced to a flux of metastable He ($2^3S$) atoms and ground state He atoms when it enters the gas-mixing region.

For comparison, various other techniques have been developed to excite and ionize gas phase species for MS. These include electron ionization (EI), chemical ionization and photo ionization with lasers or other intense light sources. In conventional mass spectroscopy, electron ionization is carried out by electron collisions in high-energy mode (70 eV) or in the so-called low-energy mode (~8-12 eV).

The high-energy mode can present several advantages over the low-energy mode; it is highly sensitive and reproducible which makes it suitable for quantitative and trace analysis. The mass spectra obtained in high energy EI usually contain molecular ions and ion fragments that allow identification of the compound of interest. However, high energy EI can have significant limitations which can include weak or absent molecular ions, lack of ionization selectivity, and result in complex spectra from mixtures since many different ions are created from each compound. This can make data interpretation difficult due to overlapping ion signals with the same mass-to-charge ratio.

Some of the limitations and problems encountered in high energy EI can be reduced by lowering the electron ionization energy to ~8-12eV. This allows a reduction in fragmentation that can result in simpler spectra and can also allow selective ionization in few cases. However, the reduction in molecular fragmentation is achieved at the expense of a loss in sensitivity and selective ionization is decreased by the presence of an energy spread in the electron source. Furthermore, the use of the low energy mode creates problems in terms of reproducibility due to its sensitivity to source tuning parameters.

Figure 4:
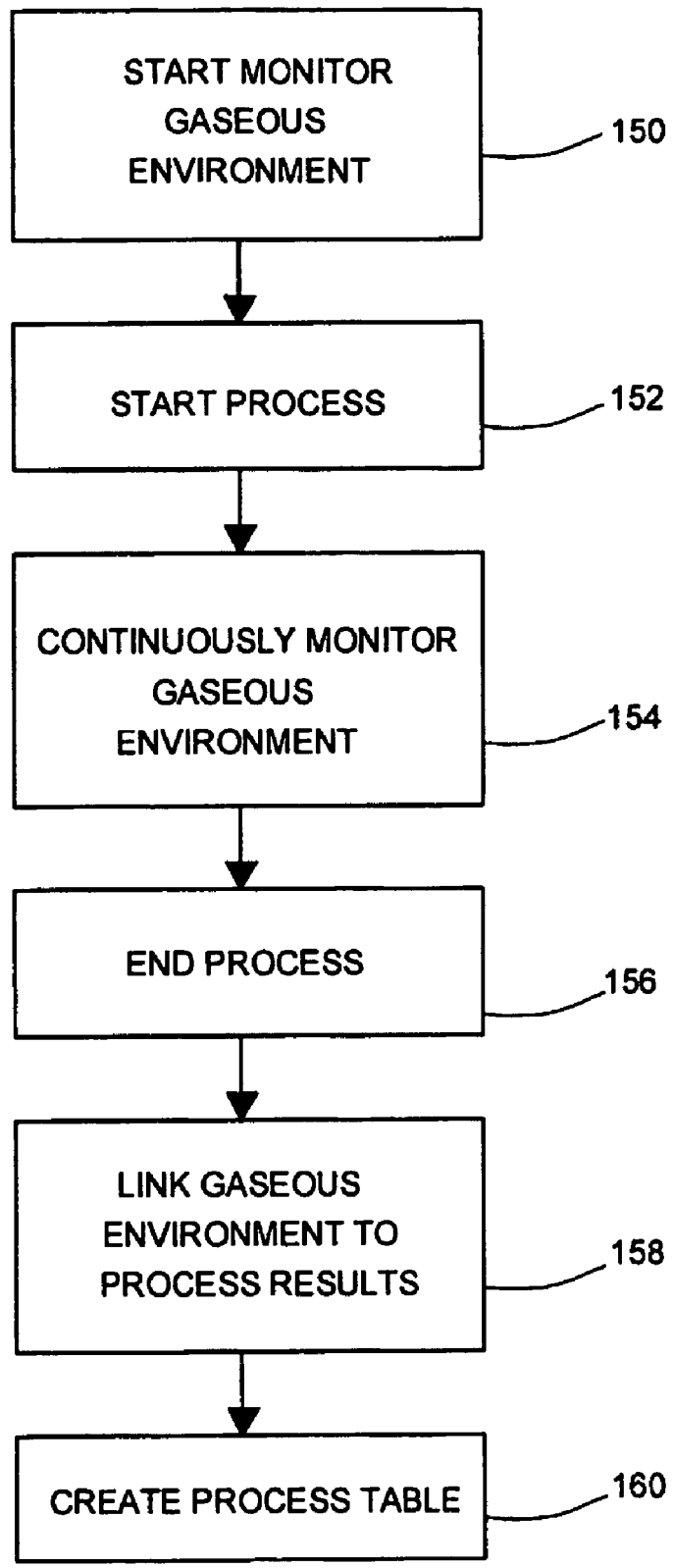
FIG. 4 is a flowchart of the steps for creating a process table according to the present invention.
Figure 5:
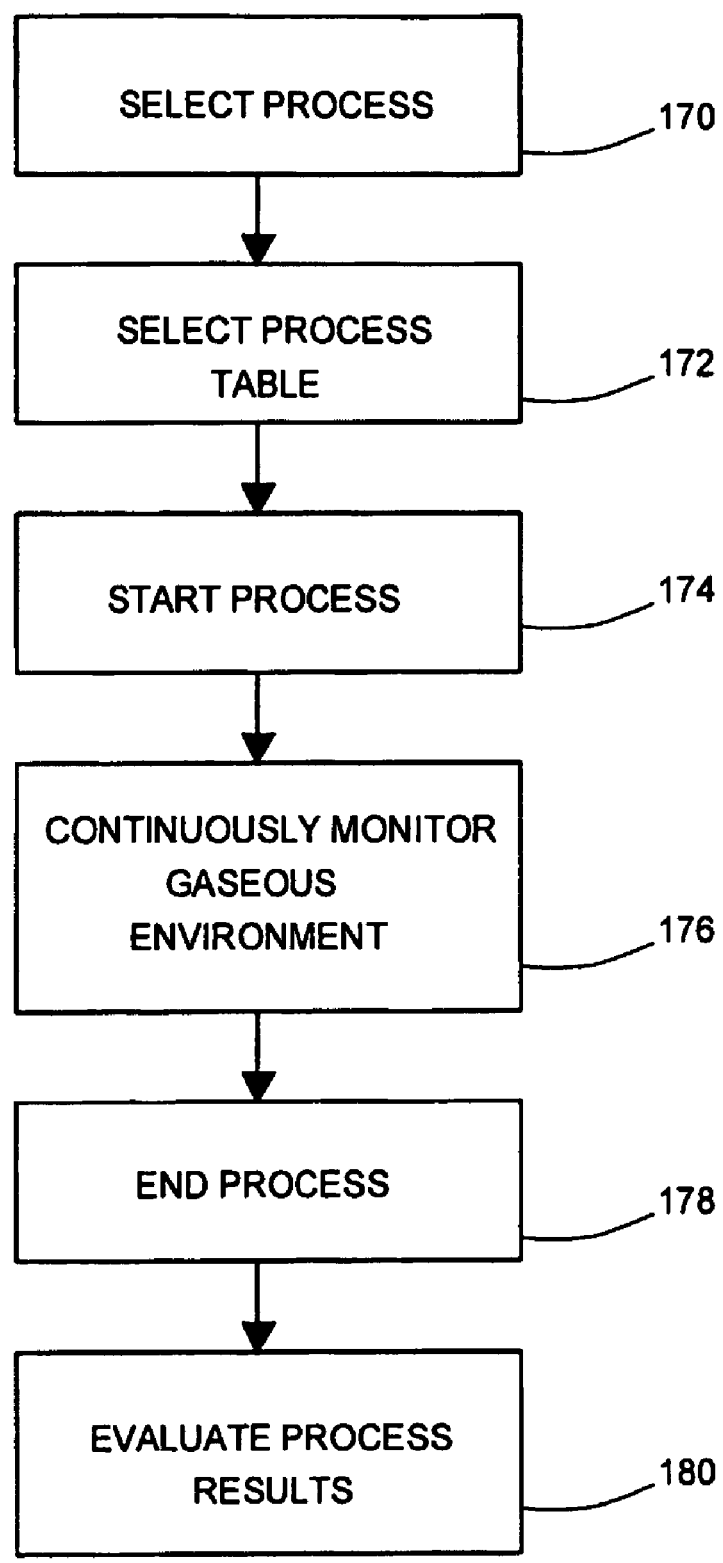
FIG. 5 is a flowchart of the steps of a monitoring process according to the present invention.

FIGS. 4 and 5 show flowcharts of steps that are carried out in the process monitoring and control according to the present invention. The procedures can apply to such processes as etching and thin film deposition.

FIG. 4 is a flowchart of the steps for creating a process table. The flowchart comprises steps that establish a relationship between the gaseous environment for a specific process and physical properties of the processed wafer. The process results can contain physical properties such as etch rate and etch uniformity for an etching process and deposition rate, film uniformity and electrical properties for a deposition processes such as CVD or PVD.

Step 150 starts the monitoring of the gaseous environment associated with a selected process. This step involves establishing a baseline for the monitored signals. For example, the monitored parameters can include pressure, gas flows, gas ratios and gas impurities.

In step 152, the selected process is initiated and run according to a specific recipe. The process is continuously monitored through the gaseous environment in step 154. In step 156, the process is terminated.

In step 158, the physical properties of the process results are linked to one or more gas species or gas ratios present in the gaseous environment during the process. The results in step 158 for multiple runs can be subjected to analysis using statistical process control. The statistical analysis results are used to establish working tolerances for the process. These results are used to create a process table in step 160.

FIG. 5 is a flowchart of the steps of a monitoring process using the process table created in FIG. 4. After a process that leads to a physical property and the corresponding process table 160 from FIG. 4 have been selected in steps 170 and 172, respectively, the process is started in step 174. The gaseous environment is continuously monitored in step 176 during the process. The process is ended in step 178 and the process results are evaluated in step 180.

For example, when an etching process involves endpoint detection, step 176 can be used to indicate when the process endpoint is reached and subsequently the process is terminated in step 178.

In step 180, the process evaluation includes determining a difference between the designated physical property and an actual physical property resulting from process steps 152-156 in FIG. 4. In the case of a process step such as thin film deposition, if the monitored gaseous environment is within a range as determined by the process table, then the actual physical property is within the tolerances of the designated property. On the other hand, if the resulting gaseous environment is outside the range, then the actual physical property is outside the tolerances of the designated physical property. In such a case, the method indicates that the wafer is outside the acceptable limits.

The results of step 180 for multiple runs can be subjected to analysis using statistical process control. The statistical analysis results can be used to continuously revise the process as needed to stay within the established tolerances.

This invention provides a method to monitor gas profiles during a semiconductor processing step. The preferred monitoring point is downstream from the process chamber due to practical and economical reasons. Importantly, the monitoring point is non-evasive to the process chamber and can be located where access to the system is physically feasible.

The identification of important gaseous species in the chamber effluent and monitoring ratios of gaseous species provides a fingerprint of important process variables and offers an early warning system. Furthermore, the invention is capable of alerting to changes when process window limits are approached, that will eventually throw the process out of specification. The invention can also be utilized to determine whether or not a given run has produced a satisfactory result. This can be done by comparison of the run profile to a collection of gas profiles that represent, based on previously established criteria, successful or unsuccessful runs. If an unsuccessful run is encountered, the invention provides means for classifying the fault, followed by terminating the process or correcting the fault.

In addition to etching and deposition processes, the invention can also be applied to chamber cleaning and chamber conditioning after chamber cleaning. Chamber cleaning is evaluated by monitoring gaseous etching products and detecting the endpoint of a successful cleaning step. For chamber cleaning it is advantageous to have a monitoring point downstream from the process zone since cleaning process is commonly unwanted material that is deposited near or downstream from the process region. Analogously, chamber conditioning following a chamber clean is also evaluated through monitoring the gaseous environment downstream from the process region.

It should be understood that various modifications and variations of the present invention may be employed in practicing the invention. It is therefore to be understood that, within the scope of the appended claims, the invention may be practiced otherwise than as specifically described herein.

The invention claimed is:

1. A monitoring system comprising:
   an effluent system configured to draw a first gas from a process chamber through a first opening;
   an excitation source in fluid communication with the effluent system and configured to enter the effluent system through a second opening and inject a second gas into the effluent system at a position downstream from the first opening; and
   at least one sensor in fluid communication with the effluent system and located downstream from the position.

2. The monitoring system as claimed in claim 1, further comprising at least one mass spectrometer coupled to the effluent system.

3. The monitoring system as claimed in claim 1, wherein said at least one sensor comprises at least one optical sensor.

4. The monitoring system as claimed in claim 3, wherein said at least one optical sensor comprises at least one monochromator.

5. The monitoring system as claimed in claim 1, wherein said at least one sensor comprises at least one mass spectrometer.

6. The monitoring system as claimed in claim 1, wherein said at least one sensor comprises at least one optical sensor and at least one mass spectrometer.

7. A monitoring system comprising:
   an effluent system configured to draw a first gas from a process chamber through a first opening;
   an excitation source in fluid communication with the effluent system and configured to enter the effluent system through a second opening and inject a second gas into the effluent system at a position downstream from the first opening; and
   a monochromator in fluid communication with the effluent system and located downstream from the position.

8. A method for analyzing gaseous species, the method comprising:
   evacuating an effluent gaseous species from a process chamber into a first opening of an effluent system;
   forming metastable atoms in an excitation source;
   injecting, through a portion of the excitation source entering the effluent system and at a position downstream from the first opening, said metastable atoms into the effluent system;
   colliding a plurality of effluent gaseous species with said injected metastable atoms to form an excited gaseous species; and
   identifying said excited gaseous species, at a position downstream from said colliding, by measuring light emitted from the excited gaseous species.

9. The method as claimed in claim 8, further comprising the step of using the excited gaseous species to characterize a plasma etching process.

10. The method as claimed in claim 8, wherein the identifying step further comprises the step of measuring the emitted light to identify at least one excited gas molecule.

11. The method as claimed in claim 8, further comprising the step of using the excited gaseous species to characterize at least one of a chemical vapor deposition (CVD) process and a physical vapor deposition (PVD) process.

12. The method as claimed in claim 8, further comprising the step of using the excited gaseous species to characterize an abatement process.

13. The method as claimed in claim 8, further comprising the step of using the excited gaseous species to characterize an endpoint in at least one of a chamber cleaning process and a chamber conditioning process.

14. The method as claimed in claim 8, further comprising the step of using the excited gaseous species to detect a fault in a plasma etching process.

15. The method as claimed in claim 8, wherein the plurality of gaseous species are formed as part of at least one plasma process, the method further comprising creating a process table containing an acceptable range for the excited gaseous species during at least a portion of the at least one plasma process.

16. The method as claimed in claim 15, the method further comprising:
    performing at least one plasma process an additional time;
    colliding a plurality of additional effluent gas molecules from the at least one plasma process performed the additional time to produce an additional excited gaseous species;
    identifying said additional excited gaseous species from the at least one plasma process performed the additional time by measuring light emitted from the additional excited gaseous species;
    characterizing the at least one plasma process performed the additional time using the additional excited gaseous species from the at least one plasma process performed the additional time; and
    declaring a fault when the at least one plasma process performed the additional time includes additional excited gaseous species outside of the acceptable range.

17. A method for analyzing gaseous species, the method comprising:
    evacuating an effluent gaseous species from a process chamber into a first opening of an effluent system;
    forming metastable atoms in an excitation source;
    injecting, through a portion of the excitation source entering the effluent system and at a position downstream from the first opening, said metastable atoms into the effluent system;
    colliding a plurality of effluent gaseous species with said injected metastable atoms to form an ionized gaseous species; and
    identifying the ionized gaseous species at a point downstream from the position.

18. The method as claimed in claim 17, further comprising the step of using the ionized gaseous species to characterize a plasma etching process.

19. The method as claimed in claim 17, further comprising the step of using the ionized gaseous species to characterize at least one of a chemical vapor deposition (CVD) process and a physical vapor deposition (PVD) process.

20. The method as claimed in claim 17, further comprising the step of using the ionized gaseous species to characterize an abatement process.

21. The method as claimed in claim 17, wherein the identifying step further comprises the step of measuring ion current to identify the gaseous species.

22. The method as claimed in claim 17, further comprising the step of using the ionized gaseous species to characterize an endpoint in at least one of a chamber cleaning process and a chamber conditioning process.

23. The method as claimed in claim 17, further comprising the step of using the ionized gaseous species to detect a fault in a plasma etching process.

24. The method as claimed in claim 17, wherein the plurality of gaseous species are formed as part of at least one plasma process, the method further comprising:
    creating a process table containing an acceptable range for the ionized gaseous species during at least a portion of the at least one plasma process.

25. The method as claimed in claim 24, wherein the method further comprising:
    performing the at least one plasma process an additional time;
    colliding a plurality of additional effluent gas molecules from the at least one plasma process performed the additional time to produce an additional ionized gaseous species;
    identifying said additional ionized gaseous species from the at least one plasma process performed the additional time;
    characterizing the at least one plasma process performed the additional time using the additional ionized gaseous species from the at least one plasma process performed the additional time; and
    declaring a fault when the at least one plasma process performed the additional time includes additional ionized gaseous species outside of the acceptable range.

26. A method for analyzing gaseous species, the method comprising:
    evacuating an effluent gaseous species from a process chamber into a first opening of an effluent system;
    forming metastable atoms in an excitation source;
    injecting, through a portion of the excitation source entering the effluent system and at a position downstream from the first opening, said metastable atoms into the effluent system;
    colliding a plurality of effluent gaseous species with said injected metastable atoms to form excited and ionized gaseous species;
    identifying the excited gaseous species, at a position downstream from said colliding, by measuring light emitted from the excited gaseous species; and
    identifying the ionized gaseous species.

27. The method as claimed in claim 26, further comprising the step of using at least one of the excited gaseous species and the ionized gaseous species to characterize a plasma etching process.

28. The method as claimed in claim 26, further comprising the step of using at least one of the excited gaseous species and the ionized gaseous species to characterize at least one of a chemical vapor deposition (CVD) process and a physical vapor deposition (PVD) process.

29. The method as claimed in claim 26, further comprising the step of using at least one of the excited gaseous species and the ionized gaseous species to characterize an abatement process.

30. The method as claimed in claim 26, further comprising the step of using at least one of the excited gaseous species and the ionized gaseous species to characterize an endpoint in at least one of a chamber cleaning process and a chamber conditioning process.

31. The method as claimed in claim 26, further comprising the step of using at least one of the excited gaseous species and the ionized gaseous species to detect a fault in a plasma etching process.

32. The method as claimed in claim 26, wherein the plurality of gaseous species are formed as part of at least one plasma process, the method further comprising:
creating a process table containing an acceptable range for the excited gaseous species and the ionized gaseous species during at least a portion of the at least one plasma process.

33. The method as claimed in claim 32, wherein the method further comprising:
performing the at least one plasma process an additional time;
colliding a plurality of additional effluent gas molecules from the at least one plasma process performed the additional time to produce additional excited and ionized gaseous species;
identifying said additional excited gaseous species from the at least one plasma process performed the additional time by measuring light emitted from said excited gaseous species;
identifying said additional ionized gaseous species from the at least one plasma process performed the additional time;
characterizing the at least one plasma process performed the additional time using the additional excited and ionized gaseous species from the at least one plasma process performed the additional time; and
declaring a fault when the at least one plasma process performed the additional time includes additional excited and ionized gaseous species outside of the acceptable range.

34. The method as claimed in any one of claims 8, 17 and 26, wherein the forming step further comprises the step of processing a gaseous stream of rare gas atoms using an electric field.

35. A plasma processing system comprising:
a plasma process chamber;
a pump in fluid communication with the plasma process chamber; and
a monitoring system in fluid communication with the pump, wherein the monitoring system includes
an effluent system coupled to the pump configured to draw a first gas from the process chamber through a first opening,
an excitation source coupled to the effluent system and configured to enter the effluent system through a second opening and inject a second gas into the effluent system at a position downstream from the first opening, and
a monochromator coupled to the effluent system and located downstream from the position.

36. The plasma processing system as claimed in claim 35, further comprising a second pump coupled to the monitoring system.

37. The plasma processing system as claimed in claim 35, further comprising at least one controller coupled to the plasma processing chamber and the monitoring system.

38. The plasma processing system as claimed in claim 35, further comprising at least one mass spectrometer coupled to the monitoring system.

39. A method for analyzing gaseous species, the method comprising:
performing at least one plasma process;
evacuating an effluent gaseous species from a process chamber into a first opening of an effluent system;
forming metastable atoms in an excitation source;
injecting, through a portion of the excitation source entering the effluent system and at a position downstream from the first opening, said metastable atoms into the effluent system;
colliding a plurality of effluent gaseous species with said injected metastable atoms to form an excited gaseous species;
identifying at a point downstream from the position the excited gaseous species by measuring light emitted from the excited gaseous species;
characterizing the at least one plasma process using the excited gaseous species;
determining a change in the excited gaseous species over time; and
establishing an endpoint for the at least one plasma process based on the change in the excited gaseous species over time.

40. A method for analyzing gaseous species, the method comprising:
performing at least one plasma process;
evacuating an effluent gaseous species from a process chamber into a first opening of an effluent system;
forming metastable atoms in an excitation source;
injecting, through a portion of the excitation source entering the effluent system and at a position downstream from the first opening, said metastable atoms into the effluent system;
colliding a plurality of effluent gaseous species with said injected metastable atoms to form an ionized gaseous species;
identifying said ionized gaseous species at a point downstream from the position;
characterizing the at least one plasma process using the ionized gaseous species;
determining a change in the ionized gaseous species over time; and establishing an endpoint for the at least one plasma process based on the change in the ionized gaseous species over time.

41. A method for analyzing gaseous species, the method comprising:
performing at least one plasma process;
evacuating an effluent gaseous species from a process chamber into a first opening of an effluent system;
forming metastable atoms in an excitation source;
injecting, through a portion of the excitation source entering the effluent system and at a position downstream from the first opening, said metastable atoms into the effluent system;
colliding a plurality of effluent gaseous species with said injected metastable atoms to form an excited and ionized gaseous species;
identifying the excited gaseous species, at a position downstream from said colliding, by measuring light emitted from the excited gaseous species;
identifying the ionized gaseous species at a point downstream from the position;
characterizing the at least one plasma process using the excited and ionized gaseous species;
determining a change in the excited and ionized gaseous species over time; and
establishing an endpoint for the at least one plasma process based on the change in the excited and ionized gaseous species over time.

42. The monitoring system as claimed in claim 1, further comprising:
an exhaust located downstream from the position and configured to draw at least the first gas from the effluent system.

43. The monitoring system as claimed in claim 7, further comprising:
an exhaust located downstream from the position and configured to draw at least the first gas from the effluent system.

44. The plasma processing system as claimed in claim 35, wherein the monitoring system further comprises:
an exhaust located downstream from the position and configured to draw at least the first gas from the effluent system.

45. The monitoring system as claimed in claim 1, wherein the first gas reacts with the second gas.

46. The monitoring system as claimed in claim 7, wherein the first gas reacts with the second gas.

47. The monitoring system as claimed in claim 35 wherein the first gas reacts with the second gas.

* * * * *